United States Patent
Liao et al.

(10) Patent No.: US 8,039,930 B2
(45) Date of Patent: Oct. 18, 2011

(54) PACKAGE STRUCTURE FOR WIRELESS COMMUNICATION MODULE

(75) Inventors: Kuo-Hsien Liao, Kaohsiung (TW); Dian-Rung Li, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 205 days.

(21) Appl. No.: 12/570,295

(22) Filed: Sep. 30, 2009

(65) Prior Publication Data
US 2010/0200965 A1 Aug. 12, 2010

(30) Foreign Application Priority Data
Feb. 11, 2009 (CN) .......................... 2009 1 0007479

(51) Int. Cl.
*H01L 23/552* (2006.01)
(52) U.S. Cl. .............................. 257/659; 257/E23.114
(58) Field of Classification Search .................. 257/659, 257/E23.114
See application file for complete search history.

(56) References Cited

U.S. PATENT DOCUMENTS

| | | | |
|---|---|---|---|
| 7,629,674 B1 * | 12/2009 | Foster | 257/659 |
| 7,772,046 B2 * | 8/2010 | Pagaila et al. | 438/127 |
| 7,799,602 B2 * | 9/2010 | Pagaila et al. | 438/106 |
| 2009/0302435 A1 * | 12/2009 | Pagaila et al. | 257/659 |

* cited by examiner

*Primary Examiner* — Trung Q Dang
(74) *Attorney, Agent, or Firm* — Cheng-Ju Chiang

(57) ABSTRACT

A package structure for a wireless communication module is disclosed and includes: a substrate having an upper surface defining a supporting region, an annular ground pad surrounding the supporting region, and at least one auxiliary ground pad formed in the supporting region; at least one chip mounted on the supporting region and electrically connected to the substrate; and a shielding lid having a receiving space for receiving the chip, a ground end surface electrically connected to the annular ground pad of the substrate, and at least one auxiliary ground portion electrically connected to the auxiliary ground pad for forming at least one auxiliary ground pathway to adjust the characteristic of the enhanced peak generated by the cavity-resonance effect of the shielding lid. Thus, the enhanced peak can be shifted out of a regulated frequency range of the EMI shielding test, so that the yield thereof can be increased.

17 Claims, 4 Drawing Sheets

PACKAGE STRUCTURE FOR WIRELESS COMMUNICATION MODULE

FIELD OF THE INVENTION

The present invention relates to a package structure for a wireless communication module, and more particularly to a package structure for reducing the effect of cavity resonance in a wireless communication module.

BACKGROUND OF THE INVENTION

Recently, the manufacturers of semiconductor assembly gradually develop various different package structures for satisfying needs of various high-density assembly, wherein various different design concepts of system-in-package (SIP) structures are frequently used to construct package structures for wireless communication modules, which will be applied to various electronic devices (such as mobile phones or global positioning system, GPS) which need wireless communication functions. Generally, the SIP structure can be classified into multi-chip-module (MCM) structure, package-on-package (POP) structure, package-in-package (PIP) structure and etc. The MCM structure includes a substrate, a plurality of chips mounted on the same substrate, and an encapsulant for encapsulating all of the chips. The MCM structure can be further classified into stacked-die package or side-by-side package. Besides, the POP structure includes a first package having a substrate and an encapsulant, a second package stacked on an upper surface of the encapsulant of the first package, and a plurality of suitable interconnection elements (such as solder ball or gold wires) for electrically connecting the second package to the substrate of the first package, so as to construct a composite package structure. In comparison with the POP structure, the PIP structure further includes another encapsulant for encapsulating the second package, the interconnection elements and the encapsulant of the first package on the same substrate of the first package, so as to construct a different composite package structure.

For a package structure for a wireless communication module, the mono-chip-module structure or the multi-chip-module structure may be used as the package structure according to the complication of the function designs of the wireless communication module. In addition, for reducing the phenomenon of electromagnetic interference (EMI), the mono-chip-module structure or the multi-chip-module structure generally is provided with an EMI shielding lid on an upper surface of a substrate of the package structure. Thus, although a wireless communication chip in the EMI shielding lid generates electromagnetic waves due to the electromagnetic induction effect, the electromagnetic waves will be restricted by the EMI shielding lid, so as to prevent the electromagnetic waves from externally transmitting to interfere with peripheral electronic apparatuses.

Referring now FIGS. 1 and 2, a traditional package structure for a wireless communication module is illustrated, wherein the package structure comprises a substrate 11, at least one chip 12, a plurality of passive elements 13, 14 and a shielding lid 15. The substrate 11 has an upper surface for supporting and electrically connecting to the chip 12 and the passive elements 13, 14, while the substrate 11 has an annular ground pad 111 surrounding the upper surface thereof. The shielding lid 15 is a hollow lid having a ground end surface 151 which can be connected to the annular ground pad 111 of the substrate 11 by welding, in order to reduce the phenomenon of electromagnetic interference (EMI). After the production line of semiconductor assembly factory finished the package structure of the wireless communication module, the EMI shielding effect of the package structure will be tested, in order to ensure if the electromagnetic waves of the package structure in a regulated frequency range has been reduced. Only when the package structure complies with a predetermined standard rule (such as various international certifications including CCC GB4943 of China, BSMI CNS13438 of Taiwan, VCCI of Japan, MIC of Korea, FCC Part 15 of U.S.A., CE EN55022 of European Union, C-Tick ANS3548 of Australia and New Zealand and etc.), the package structure will be recognized as a good product for shipping.

However, the technical problem of the traditional package structure of the wireless communication module is described as follows: although the shielding lid 15 can restrict the electromagnetic waves generated by the chip 12 therein to prevent from interfering with the peripheral electronic apparatuses, the hollow structure of the shielding lid 15 affected by the electromagnetic waves inevitably causes the effect of cavity resonance, so that the yield of the EMI shielding test will be lowered. In other words, even though most of the electromagnetic waves in the regulated frequency range can be weakened by the shielding lid 15, a specific electromagnetic wave of a certain frequency will be enhanced due to the resonance effect, so as to generate an enhanced peak. For example, in a package structure of a wireless communication module having a size of 10×10 mm, if the shielding lid 15 is made of copper and the thickness thereof is ranged between 0.1 to 0.15 mm, the enhanced peak generated by the shielding lid 15 is about 6.0 GHz which is a frequency check point of EMI detection for the wireless communication module. As a result, the yield of the EMI shielding test will be substantially lowered.

Therefore, it is necessary to develop a package structure for a wireless communication module to solve the problems existing in the traditional package structure, as described above.

SUMMARY OF THE INVENTION

A primary object of the present invention is to provide a package structure for a wireless communication module, wherein an upper surface of a substrate has an annular ground pad, a supporting region defined within the annular ground pad, and an auxiliary ground pad in the supporting region, while a shielding lid has an auxiliary ground portion electrically connected to the auxiliary ground pad, so as to form an auxiliary ground pathway for changing the property of the enhanced peak generated by the effect of cavity resonance. Thus, the enhanced peak can be shifted out of the regulated frequency range of the EMI shielding test, so that the yield of the EMI shielding test can be increased.

A secondary object of the present invention is to provide a package structure for a wireless communication module, wherein the design of a substrate can be partially changed, i.e. an existed alignment pad in the supporting region is grounded to be used as the auxiliary ground pad, so that the cost of entire design of the substrate can be lowered.

To achieve the above object, a package structure for a wireless communication module according to a preferred embodiment of the present invention comprises a substrate, at least one chip and a shielding lid. The substrate has an upper surface defining a supporting region, an annular ground pad surrounding the supporting region, and at least one auxiliary ground pad formed in the supporting region. The chip is mounted on the supporting region and electrically connected to the substrate. The shielding lid has a receiving space for receiving the chip, a ground end surface electrically connected to the annular ground pad of the substrate, and at least one auxiliary ground portion electrically connected to the auxiliary ground pad of the substrate for forming at least one auxiliary ground pathway.

In one embodiment of the present invention, the package structure further comprises at least one electronic component having a ground terminal which is electrically connected between the auxiliary ground portion of the shielding lid and the auxiliary ground pad of the substrate.

In one embodiment of the present invention, the auxiliary ground portion of the shielding lid is an opening.

In one embodiment of the present invention, the auxiliary ground portion of the shielding lid is a recess.

In one embodiment of the present invention, the electronic component is at least one passive element or at least one active element.

In one embodiment of the present invention, the passive element is a resistor, a capacitor or an inductor.

In one embodiment of the present invention, the active element is a diode, a triode or a light emitting diode (LED).

In one embodiment of the present invention, the package structure further comprises an electro-conductive material between the ground terminal of the electronic component and the auxiliary ground portion of the shielding lid.

In one embodiment of the present invention, the package structure further comprises an electro-conductive material between the ground terminal of the electronic component and the auxiliary ground pad of the substrate.

In one embodiment of the present invention, the auxiliary ground portion of the shielding lid is a recess which is electrically connected to the auxiliary ground pad of the substrate.

In one embodiment of the present invention, the package structure further comprises an electro-conductive material between the auxiliary ground portion of the shielding lid and the auxiliary ground pad of the substrate.

In one embodiment of the present invention, the electro-conductive material is a solder or an electro-conductive adhesive.

In one embodiment of the present invention, the auxiliary ground pad of the substrate is at least one alignment pad in the supporting region of the substrate.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 3:
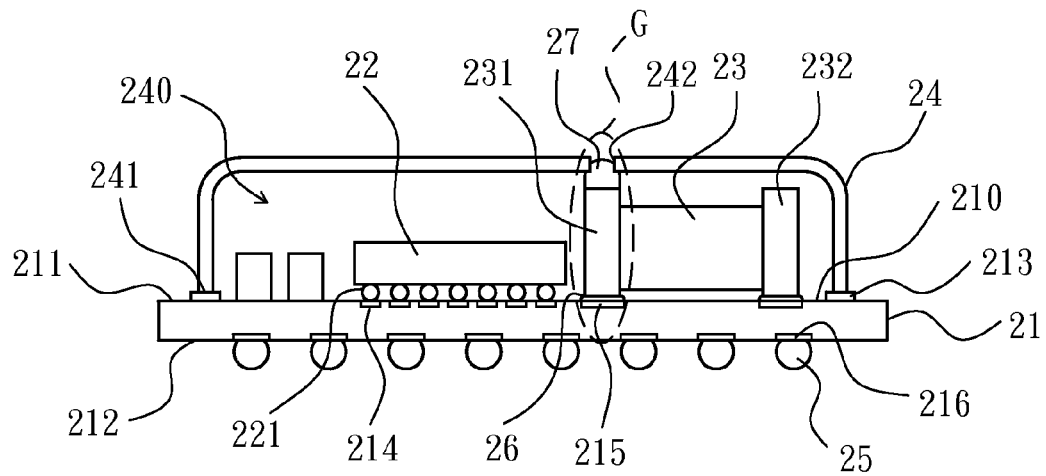
FIG. 3 is an assembled cross-sectional view of a package structure for a wireless communication module according to a first embodiment of the present invention.
Figure 4:
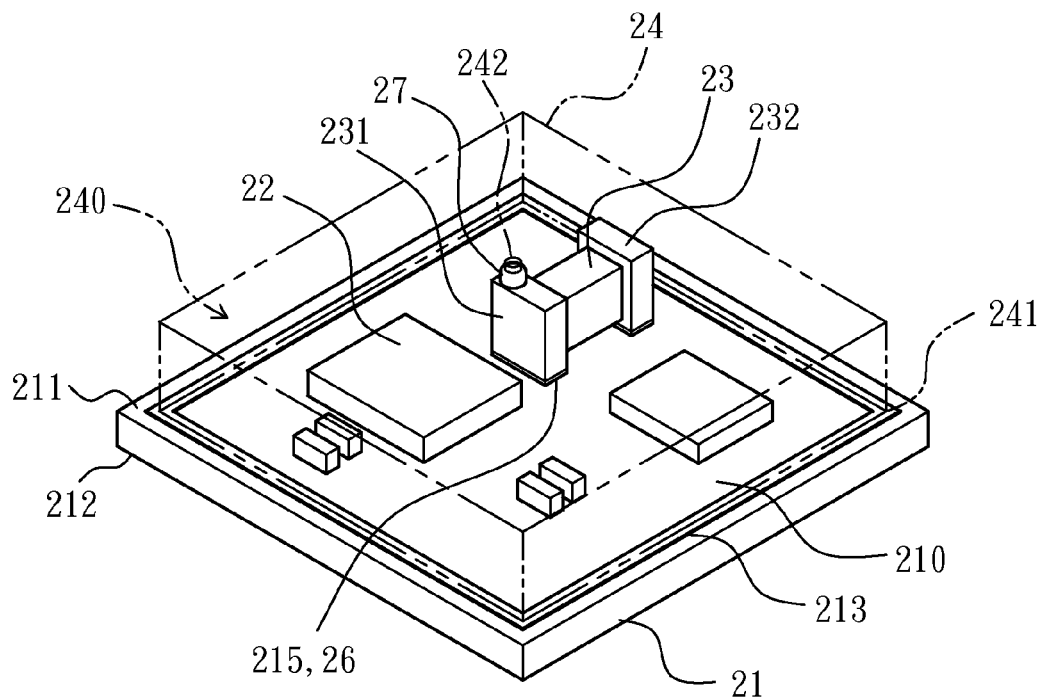
FIG. 4 is an assembled perspective view of the package structure for the wireless communication module according to the first embodiment of the present invention.

Referring now to FIGS. 3 and 4, a package structure for a wireless communication module according to a first embodiment of the present invention is illustrated. As shown, the package structure comprises a substrate 21, at least one chip 22, at least one electronic component 23 and a shielding lid 24. According to the amount of the chip 22, the package structure of the present invention can be constructed into a mono-chip-module structure or a multi-chip-module structure for the wireless communication module, which is suitably applied to various standard rules of wireless communication, such as WiMAX, Wi-Fi, Blue-Tooth and etc., but not limited thereto.

Referring to FIGS. 3 and 4, in the first embodiment of the present invention, the substrate 21 can be selected from a mono-layer or multi-layer structure of printed circuit board or ceramic circuit board. The substrate 21 has an upper surface 211 and a lower surface 212, wherein the upper surface 211 is defined with a supporting region 210. Furthermore, an annular ground pad 213 surrounds the supporting region 210, while a plurality of connection pads 214 and at least one auxiliary ground pad 215 is formed on the supporting region 210. The supporting region 210 is used to support the chip 22, the electronic component 23 and other components. The annular ground pad 213, the connection pads 214 and the auxiliary ground pad 215 are metal pads (such as copper pads) defined by a patterned surface circuit on the upper surface 211. The annular ground pad 213 is preferably a continuous annular structure, but also can be an arrangement including a plurality of intermittent strips surrounding the supporting region 210. The connection pads 214 are used to electrically connect to the chip 22, while the auxiliary ground pad 215 is used to provide a grounding function. In the first embodiment, the auxiliary ground pad 215 is at least one alignment pad in the supporting region 210 of the substrate 21, which is a marker to align a plurality of laminates with each other during a lamination process or a build-up process of the substrate 21. In the present invention, the design of the alignment pad can be partially changed to be used as the auxiliary ground pad 215 without changing most of the design of the substrate 21. Thus, the size of the substrate 21 will not be excessively increased, while the cost of entire design of the substrate 21 can be lowered. In addition, the lower surface 212 further has a plurality of connection pads 216 for electrically connecting to a plurality of input/output terminals 25, such as solder balls or pins. For certain products, the connection pads 216 can be directly used as input/output terminals.

Referring still to FIGS. 3 and 4, in the first embodiment of the present invention, the chip 22 can be selected from dies formed by cutting a silicon wafer. For example, the chip 22 can be a flip chip (FC) or a wire-bonding chip. The chip 22 is electrically connected to the connection pads 214 of the supporting region 210 of the substrate 21 by a plurality of connection elements 221. In the first embodiment, the chip 22 is a flip chip having a wireless communication function, wherein an active surface thereof faces the substrate 21 and the connection elements 221 are selected from solder bumps or gold bumps. Furthermore, the connection elements 221 can be exposed, or encapsulated by an underfill (not-shown) to protect the connection elements 221. In another embodiment, the chip 22 is a wire-bonding chip (not-shown) having a wireless communication function, wherein an active surface thereof faces upwardly and is away from the substrate 21, while the connection elements 221 are selected from metal wires (not-shown), such as gold wires. The connection elements 221 can be exposed, or encapsulated by a molding compound (not-shown) to protect the chip 22 and the connection elements 221.

Referring still to FIGS. 3 and 4, in the first embodiment of the present invention, the amount of the electronic component 23 can be one, two or more than two, but at least one of the electronic component 23 must provide a ground terminal 231 which can be electrically connected to the auxiliary ground pad 215 of the supporting region 210 of the substrate 21 by an electro-conductive material 26. Moreover, the other electrical terminal 232 of the electronic component 23 can be electrically connected to the connection pad 214 of the supporting region 210 of the substrate 21. The electrical connections of the ground terminal 231 and the electrical terminal 232 can be carried out by the surface mount technology (SMT). In the first embodiment, the electronic component 23 can be selected from at least one passive element or at least one active element, wherein the passive element is a resistor, a capacitor or an inductor, while the active element is a diode, a triode or a light emitting diode (LED). However, the electronic component 23 can be selected from other types of the passive element or the active element. In addition, the electro-conductive material 26 is preferably selected from a solder or an electro-conductive adhesive, wherein the electro-conductive adhesive can be a silver paste with silver powders or an anisotropic conductive film (ACF) without limitation.

Referring still to FIGS. 3 and 4, in the first embodiment of the present invention, the shielding lid 24 is generally a hollow metal lid made of copper, aluminum, nickel, ion, silver, gold or alloy thereof, but not limited thereto. Furthermore, the surface of the shielding lid 24 can be selectively coated with a protective layer (not-shown), such as a nickel layer or a gold layer. In the first embodiment, the shielding lid 24 has a receiving space 240, a ground end surface 241 and at least one auxiliary ground portion 242. The receiving space 240 is used for receiving the chip 22 and the electronic component 23. The ground end surface 241 is formed on an opening edge of the receiving space 240 of the shielding lid 24, and electrically connected to the annular ground pad 213 of the substrate 21. The auxiliary ground portion 242 is corresponding to the auxiliary ground pad 215 of the substrate 21, and electrically connected to the auxiliary ground pad 215 of the substrate 21 by the ground terminal 231 of the electronic component 23, so as to form at least one auxiliary ground pathway "G". Moreover, the auxiliary ground portion 242 of the shielding lid 24 is preferably an opening, while the package structure further comprises an electro-conductive material 27 between the ground terminal 231 of the electronic component 23 and the auxiliary ground portion 242 of the shielding lid 24. The opening (i.e. the auxiliary ground portion 242) is advantageous to externally fill the electro-conductive material 27 into the shielding lid 24 for electrically connecting to the ground terminal 231 of the electronic component 23. The electro-conductive material 27 is preferably selected from a solder or an electro-conductive adhesive, wherein the electro-conductive adhesive can be a silver paste with silver powders or an anisotropic conductive film (ACF) without limitation.

Figure 1:
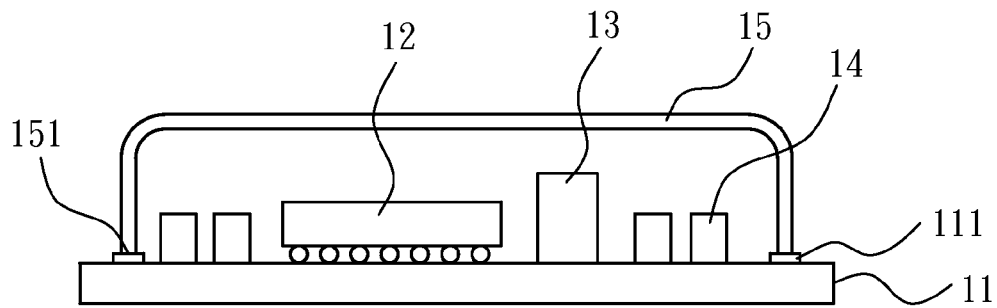
FIG. 1 is an assembled cross-sectional view of a traditional package structure for a wireless communication module.
Figure 2:
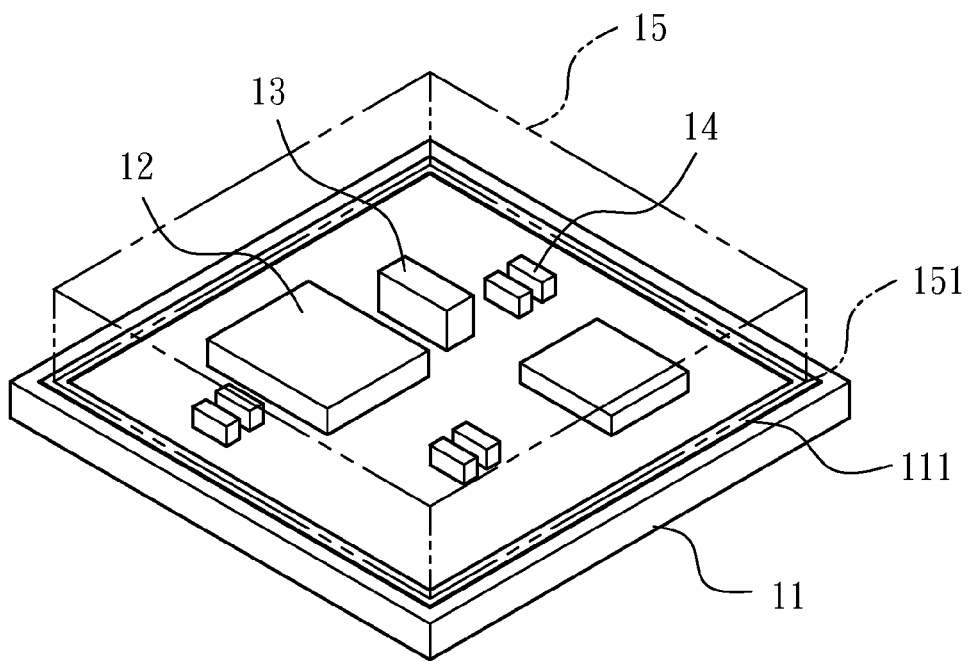
FIG. 2 is an assembled perspective view of the traditional package structure for the wireless communication module.

Referring back to FIGS. 3 and 4, in the first embodiment of the present invention, after the assembly process of the package structure for the wireless communication module is finished, an EMI shielding test of the package structure is carried out. At this time, the auxiliary ground pathway "G" commonly defined by the auxiliary ground portion 242, the electro-conductive material 27, the ground terminal 231, the electro-conductive material 26 and the auxiliary ground pad 215 can be used to change the cavity shape of the receiving space 240 of the shielding lid 24, so as to adjust the characteristic of the enhanced peak generated by the cavity-resonance effect of the shielding lid 24. Thus, the enhanced peak can be shifted out of a regulated frequency range of the EMI shielding test, so that the yield of the EMI shielding test can be increased. For example, in a package structure of a wireless communication module having a size of 10×10 mm, if the shielding lid 24 is made of copper and the thickness thereof is ranged between 0.1 to 0.15 mm, the enhanced peak generated by the shielding lid 24 having the auxiliary ground pathway "G" is about 12.0 GHz. In comparison with the traditional package structure for the wireless communication module, as shown in FIGS. 1 and 2, which has an enhanced peak about 6.0 GHz, the auxiliary ground pathway "G" of the present invention certainty shifts the enhanced peak out of the regulated frequency range of general EMI shielding tests. Since the enhanced peak of electromagnetic waves is not within the regulated frequency range, the yield of the EMI shielding test will be substantially enhanced. If the regulated frequency range of the EMI shielding test is changed according to product types, the present invention can correspondingly change the enhanced peak by adjusting the size or the amount of the auxiliary ground pathway "G" during designing the shielding lid 24. As a result, the present invention can efficiently prevent the enhanced peak from being within the changed regulated frequency range, so that the package structure with the auxiliary ground pathway "G" is suitably applied to various different products of wireless communication modules.

Figure 5:
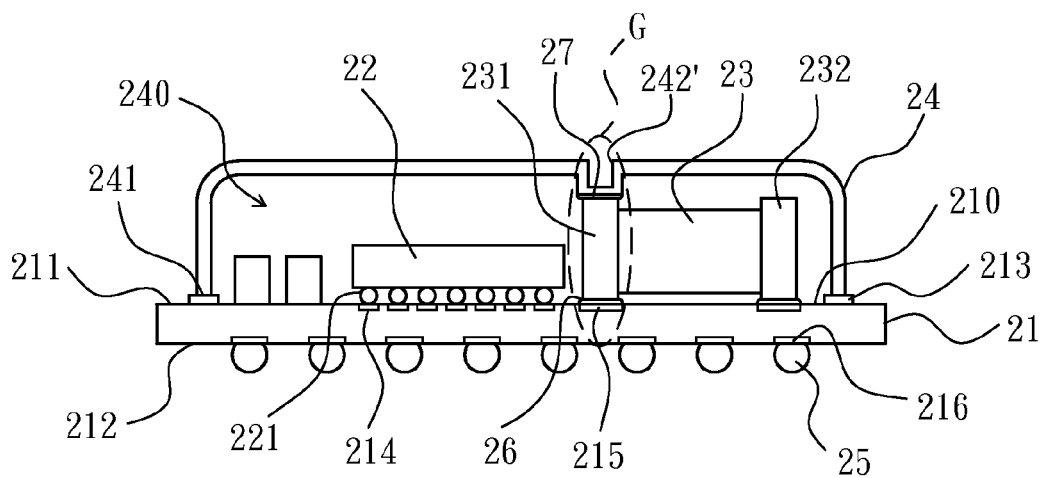
FIG. 5 is an assembled cross-sectional view of a package structure for a wireless communication module according to a second embodiment of the present invention.
Figure 6:
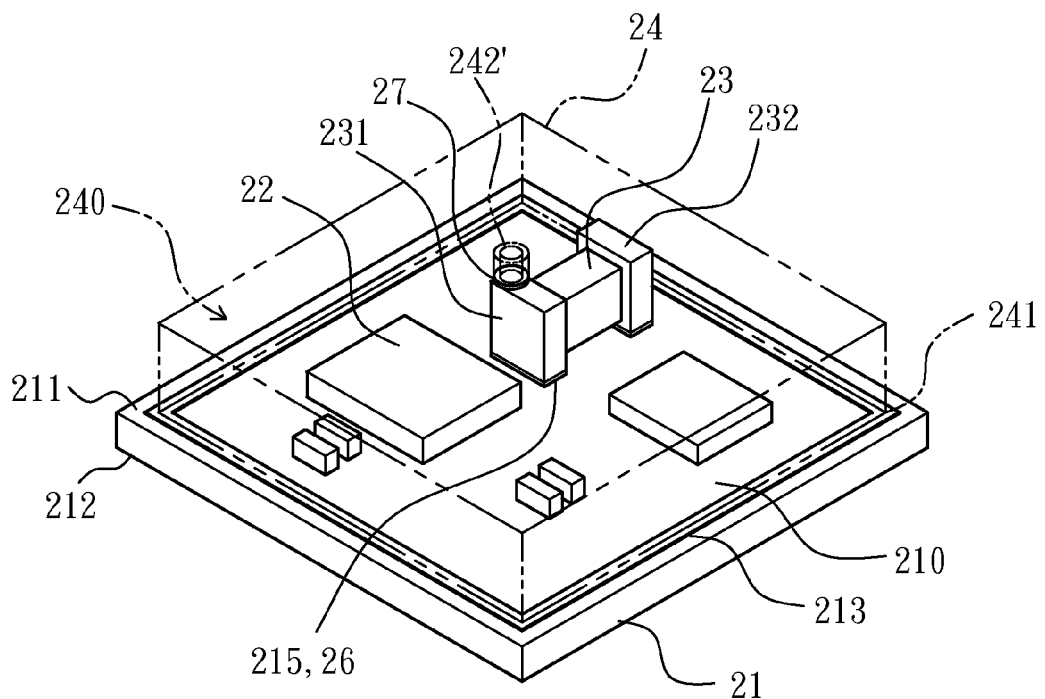
FIG. 6 is an assembled perspective view of the package structure for the wireless communication module according to the second embodiment of the present invention.

Referring now to FIGS. 5 and 6, a package structure for a wireless communication module according to a second embodiment of the present invention is illustrated and similar to the first embodiment, so that the second embodiment uses similar numerals of the first embodiment. As shown, the second embodiment is characterized in that the package structure for the wireless communication module comprises the shielding lid 24 which is provided with an auxiliary ground portion 242', wherein the auxiliary ground portion 242' is a recess which is electrically connected to the ground terminal 231 of the electronic component 23 by an electro-conductive material 27. In the second embodiment, the shielding lid 24 can be finished by punching, and the recess (i.e. the auxiliary ground portion 242') can be simultaneously formed during punching. Alternatively, the shielding lid 24 can be finished by casting, and the recess (i.e. the auxiliary ground portion 242') can be simultaneously formed during casting. An auxiliary ground pathway "G" commonly defined by the auxiliary ground portion 242', the electro-conductive material 27, the ground terminal 231, the electro-conductive material 26 and the auxiliary ground pad 215 can be used to change the cavity shape of the receiving space 240 of the shielding lid 24, so as to adjust the characteristic of the enhanced peak generated by the cavity-resonance effect of the shielding lid 24. Thus, the enhanced peak can be shifted out of a regulated frequency range of the EMI shielding test, so that the yield of the EMI shielding test can be increased.

Figure 7:
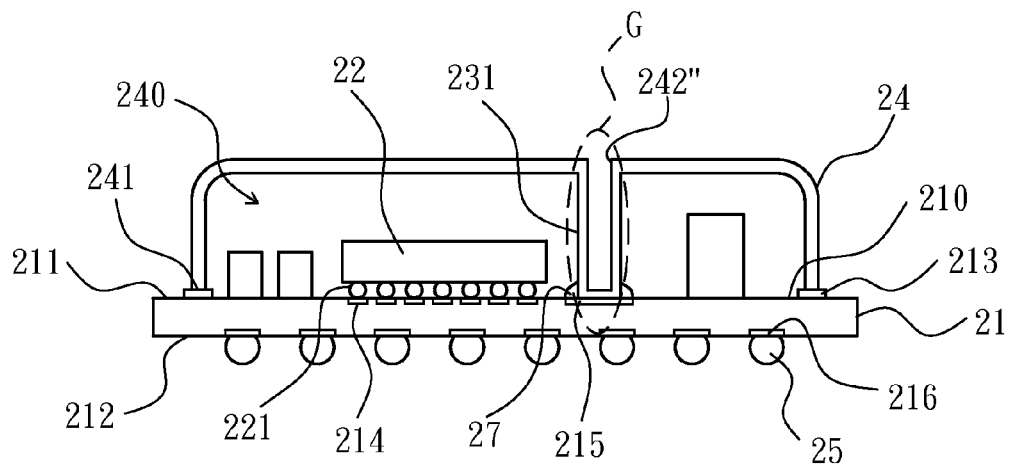
FIG. 7 is an assembled cross-sectional view of a package structure for a wireless communication module according to a third embodiment of the present invention.
Figure 8:
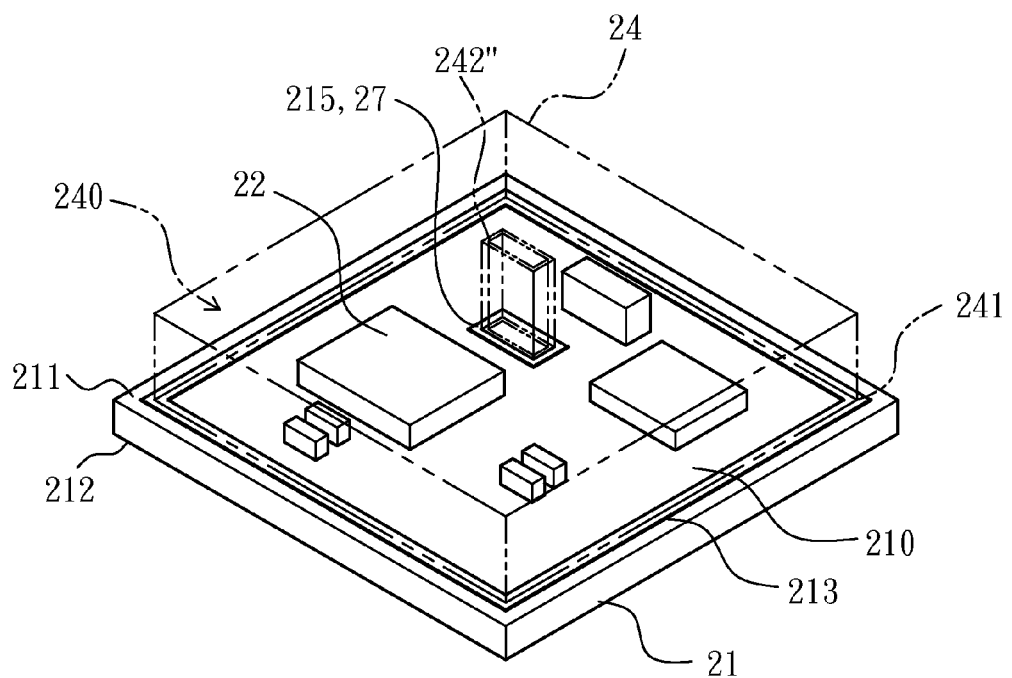
FIG. 8 is an assembled perspective view of the package structure for the wireless communication module according to the third embodiment of the present invention.

Referring now to FIGS. 7 and 8, a package structure for a wireless communication module according to a third embodiment of the present invention is illustrated and similar to the second embodiment, so that the third embodiment uses similar numerals of the second embodiment. As shown, the third embodiment is characterized in that the package structure for the wireless communication module comprises the shielding lid 24 which is provided with an auxiliary ground portion 242", wherein the auxiliary ground portion 242" is a recess which is electrically connected to the auxiliary ground pad 215 of the substrate 21 by an electro-conductive material 27. In the third embodiment, the recess (i.e. the auxiliary ground portion 242") of the shielding lid 24 also can be formed by punching or casting. An auxiliary ground pathway "G" commonly defined by the auxiliary ground portion 242", the electro-conductive material 27 and the auxiliary ground pad 215 also can be used to change the cavity shape of the receiving space 240 of the shielding lid 24, so as to adjust the characteristic of the enhanced peak generated by the cavity-resonance effect of the shielding lid 24. Thus, the enhanced peak can be shifted out of a regulated frequency range of the EMI shielding test, so that the yield of the EMI shielding test can be increased.

As described above, in comparison with the shielding lid 15 of the traditional package structure for the wireless communication module which easily generates the cavity-resonance effect to lower the yield of the EMI shielding test, the package structure of the present invention as shown in FIGS. 2 to 8 is provided with at least one auxiliary ground pad 215 within the supporting region 210 surrounded by the annular ground pad 213 on the upper surface 211 of the substrate 21, while the auxiliary ground pad 215 is electrically connected to the auxiliary ground portion 242 of the shielding lid 24, so as to form at least one auxiliary ground pathway "G". Thus, the auxiliary ground pathway "G" can be used to adjust the characteristic of the enhanced peak generated by the cavity-resonance effect of the shielding lid 24. Therefore, the enhanced peak can be shifted out of a regulated frequency range of the EMI shielding test, so that the yield of the EMI shielding test can be increased. Furthermore, the design of the substrate 21 can be partially changed, i.e. an existed alignment pad in the supporting region 210 of the substrate 21 is grounded to be used as the auxiliary ground pad 215 without changing most of the design of the substrate 21. Thus, the size of the substrate 21 will not be excessively increased, while the cost of entire design of the substrate 21 can be lowered.

The present invention has been described with a preferred embodiment thereof and it is understood that many changes and modifications to the described embodiment can be carried out without departing from the scope and the spirit of the invention that is intended to be limited only by the appended claims.

What is claimed is:

1. A package structure for a wireless communication module, comprising:
    a substrate having an upper surface defining a supporting region, an annular ground pad surrounding the supporting region, and at least one auxiliary ground pad formed in the supporting region;
    at least one chip mounted on the supporting region and electrically connected to the substrate; and
    a shielding lid having a receiving space for receiving the chip, a ground end surface electrically connected to the annular ground pad of the substrate, and at least one auxiliary ground portion;
    wherein the auxiliary ground portion of the shielding lid is electrically connected to the auxiliary ground pad of the substrate for forming at least one auxiliary ground pathway.

2. The package structure for the wireless communication module of claim 1, further comprising at least one electronic component having a ground terminal which is electrically connected between the auxiliary ground portion of the shielding lid and the auxiliary ground pad of the substrate.

3. The package structure for the wireless communication module of claim 2, wherein the auxiliary ground portion of the shielding lid is an opening.

4. The package structure for the wireless communication module of claim 2, wherein the auxiliary ground portion of the shielding lid is a recess.

5. The package structure for the wireless communication module of claim 2, wherein the electronic component is at least one passive element or at least one active element.

6. The package structure for the wireless communication module of claim 5, wherein the passive element is a resistor, a capacitor or an inductor.

7. The package structure for the wireless communication module of claim 5, wherein the active element is a diode, a triode or a light emitting diode.

8. The package structure for the wireless communication module of claim 2, wherein the auxiliary ground pad of the substrate is at least one alignment pad in the supporting region of the substrate.

9. The package structure for the wireless communication module of claim 2, further comprising an electro-conductive material between the ground terminal of the electronic component and the auxiliary ground portion of the shielding lid.

10. The package structure for the wireless communication module of claim 9, wherein the electro-conductive material is a solder or an electro-conductive adhesive.

11. The package structure for the wireless communication module of claim 2, further comprising an electro-conductive material between the ground terminal of the electronic component and the auxiliary ground pad of the substrate.

12. The package structure for the wireless communication module of claim 11, wherein the electro-conductive material is a solder or an electro-conductive adhesive.

13. The package structure for the wireless communication module of claim 1, wherein the auxiliary ground portion of the shielding lid is a recess which is electrically connected to the auxiliary ground pad of the substrate.

14. The package structure for the wireless communication module of claim 13, wherein further comprising an electro-conductive material between the auxiliary ground portion of the shielding lid and the auxiliary ground pad of the substrate.

15. The package structure for the wireless communication module of claim 14, wherein the electro-conductive material is a solder or an electro-conductive adhesive.

16. The package structure for the wireless communication module of claim 13, wherein the auxiliary ground pad of the substrate is at least one alignment pad in the supporting region of the substrate.

17. The package structure for the wireless communication module of claim 1, wherein the auxiliary ground pad of the substrate is at least one alignment pad in the supporting region of the substrate.

* * * * *